United States Patent
Wang et al.

(10) Patent No.: US 12,267,984 B2
(45) Date of Patent: Apr. 1, 2025

(54) HEAT DISSIPATION ASSEMBLY

(71) Applicant: Delta Electronics, Inc., Taoyuan (TW)

(72) Inventors: Yi-Han Wang, Taoyuan (TW);
Chao-Fu Yang, Taoyuan (TW);
Chih-Chung Chen, Taoyuan (TW);
Kuo-Tung Hsu, Taoyuan (TW);
Meng-Yu Chen, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 231 days.

(21) Appl. No.: 17/990,373

(22) Filed: Nov. 18, 2022

(65) Prior Publication Data

US 2023/0171917 A1 Jun. 1, 2023

Related U.S. Application Data

(60) Provisional application No. 63/284,238, filed on Nov. 30, 2021.

(51) Int. Cl.
*H05K 7/20* (2006.01)

(52) U.S. Cl.
CPC ....... *H05K 7/20154* (2013.01); *H05K 7/2039* (2013.01)

(58) Field of Classification Search
CPC ........... H05K 7/20136; H05K 7/20145; H05K 7/20154; H05K 7/20163; H05K 7/20172
See application file for complete search history.

(56) References Cited

U.S. PATENT DOCUMENTS

| | | | | |
|---|---|---|---|---|
| 5,630,469 A * | 5/1997 | Butterbaugh | ......... | H01L 23/467 174/16.3 |
| 6,328,097 B1 * | 12/2001 | Bookhardt | ............ | H01L 23/467 361/679.48 |
| 6,529,375 B2 * | 3/2003 | Miyahara | .............. | H01L 23/467 257/E23.099 |
| 6,657,860 B2 * | 12/2003 | Matsui | .................. | H01L 23/467 174/16.3 |

(Continued)

FOREIGN PATENT DOCUMENTS

| CN | 2567932 Y | 8/2003 |
|---|---|---|
| JP | H02168697 A | 6/1990 |

(Continued)

*Primary Examiner* — Nelson J Nieves
(74) *Attorney, Agent, or Firm* — KIRTON McCONKIE; Evan R. Witt

(57) ABSTRACT

A heat dissipation assembly is disclosed and includes a frame and a fan. The frame includes a heat conduction channel and an airflow intake. The heat conduction channel is communication with an exterior through airflow intake. The frame includes a first plane, a second plane and an inclined plane. The first plane is disposed adjacent to the airflow intake. The inclined plane is connected between the first plane and the second plane. The second plane includes an inlet. The heat conduction channel is in communication between the airflow intake and the inlet. A cross-section area of the heat conduction channel adjacent to the airflow intake is greater than that of the heat conduction channel adjacent to the inlet. The fan is spatially corresponding to the inlet, and assembled with the frame to form an outlet in communication with the airflow intake and the heat conduction channel through the inlet.

20 Claims, 18 Drawing Sheets

(56) References Cited

U.S. PATENT DOCUMENTS

| | | | |
|---|---|---|---|
| 6,681,845 B1* | 1/2004 | Yeh | G06F 1/20 165/122 |
| 6,688,379 B2 | 2/2004 | Huang et al. | |
| 7,174,952 B1* | 2/2007 | Hong | H01L 23/467 165/122 |
| 7,359,192 B2* | 4/2008 | Yang | H01L 23/467 257/E23.099 |
| 7,443,672 B2 | 10/2008 | Peng et al. | |
| 7,447,021 B2* | 11/2008 | Chen | H05K 7/20727 361/679.48 |
| 7,447,030 B2* | 11/2008 | Hwang | F28D 15/0266 165/122 |
| 7,990,712 B2 | 8/2011 | Fang | |
| 8,069,908 B2* | 12/2011 | Chen | H01L 23/467 165/185 |
| 8,363,401 B2* | 1/2013 | Lai | H01L 23/467 361/679.48 |
| 10,178,797 B1* | 1/2019 | Lau | G06F 1/20 |
| 10,545,546 B2* | 1/2020 | Varadarajan | H05K 7/20145 |
| 11,096,312 B1* | 8/2021 | Chen | G06F 1/20 |
| 11,314,294 B2* | 4/2022 | Helberg | G06F 1/203 |
| D950,507 S * | 5/2022 | Chen | D13/179 |
| 11,716,829 B1* | 8/2023 | Tan | H05K 7/20136 361/697 |
| 11,937,411 B2* | 3/2024 | Kim | H05K 7/20909 |
| 2003/0043546 A1* | 3/2003 | Novotny | H05K 7/20172 257/E23.098 |
| 2004/0240175 A1* | 12/2004 | Brovald | G06F 1/20 361/679.5 |
| 2007/0058341 A1* | 3/2007 | Hsiao | H01L 23/467 257/E23.099 |
| 2009/0321058 A1* | 12/2009 | Uchimura | H01L 23/427 165/185 |
| 2011/0097195 A1* | 4/2011 | Horng | F04D 29/4226 415/121.2 |
| 2012/0207618 A1* | 8/2012 | Horng | F04D 29/701 415/203 |
| 2012/0262879 A1* | 10/2012 | Inoue | H05K 7/20154 361/697 |
| 2018/0014430 A1* | 1/2018 | Lin | H05K 7/20145 |
| 2018/0158748 A1* | 6/2018 | Kwon | H05K 7/2089 |
| 2018/0338387 A1* | 11/2018 | Park | G02B 6/4284 |
| 2020/0159296 A1* | 5/2020 | Zhu | H05K 7/20145 |
| 2020/0375064 A1 | 11/2020 | Chen et al. | |
| 2021/0059075 A1* | 2/2021 | Mitsui | H05K 7/20418 |
| 2021/0289660 A1* | 9/2021 | Cha | H05B 6/42 |
| 2021/0341976 A1* | 11/2021 | Helberg | H05K 7/20163 |
| 2022/0104392 A1* | 3/2022 | Lin | H05K 7/20409 |
| 2022/0272865 A1* | 8/2022 | Chien | H05K 7/20409 |
| 2022/0272872 A1* | 8/2022 | Zhou | G06F 1/20 |
| 2023/0040072 A1* | 2/2023 | Takeuchi | H05K 7/20163 |
| 2023/0127566 A1* | 4/2023 | Mito | H05K 7/20181 361/719 |
| 2023/0337406 A1* | 10/2023 | Bawa | H05K 7/2099 |
| 2024/0032254 A1* | 1/2024 | Kögler | H05K 7/20509 |

FOREIGN PATENT DOCUMENTS

| | | |
|---|---|---|
| JP | H03168399 A | 7/1991 |
| JP | 2001057493 A | 2/2001 |
| JP | 2016092328 A | 5/2016 |
| JP | 2017112190 A1 | 6/2017 |
| TW | 200636169 A | 10/2006 |

* cited by examiner

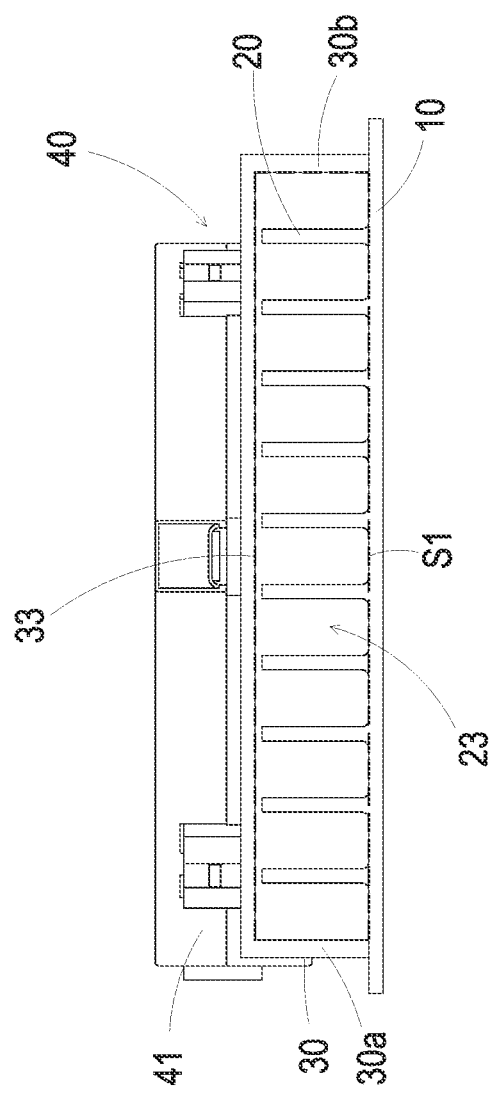
FIG. 4
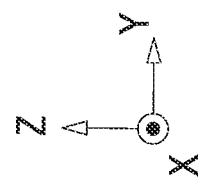

HEAT DISSIPATION ASSEMBLY

CROSS-REFERENCE TO RELATED APPLICATION

This application claims the benefit of U.S. Provisional Application No. 63/284,238 filed on Nov. 30, 2021, and entitled "IMPROVE THE PERFORMANCE AND NOISE LEVEL OF HEAT CONDUCTION CHANNEL BY SPECIFIC SECTION AREA CONTROL AND ADDITIVE EFFECT BY RELATIVE CHARACTERS". The entireties of the above-mentioned patent application are incorporated herein by reference for all purposes.

FIELD OF THE INVENTION

The present disclosure relates to a heat dissipation assembly, and more particularly to a heat dissipation assembly with a specific section area control and additive effects of relative characters for improving the performance and the noise level of the heat conduction channel thereof.

BACKGROUND OF THE INVENTION

Generally, an electronic device is combined with a heat dissipation assembly to dissipate the internal heat generated therefrom. A conventional heat dissipation assembly mainly includes a centrifugal fan and heat dissipation fins. The heat dissipation fins are disposed at the outlet of the centrifugal fan and connected to the centrifugal fan. Moreover, the heat dissipation fins are thermally coupled to the heat-generating element in the electronic device. When the heat is generated from the heat-generating element, the generated heat is conducted to the heat dissipation fins, and the cooling airflow generated by the centrifugal fan is directly blown to the heat dissipation fins from the outlet so that the effect of heat dissipation is achieved.

With the increase of heat dissipation requirements, the heat dissipation fins are further designed in the form of a heat conduction channel to match the high-speed airflow from the outlet of the centrifugal fan. However, when the high-speed airflow from the outlet of the centrifugal fan is directly blown to the heat dissipation fins disposed in the heat conduction channel, the airflow in the heat conduction channel is varied and not easy to control. Moreover, it is often accompanied by the generation of a large amount of noise. The operation mode of the centrifugal fan is that the air is inhaled in the axial direction of the impeller of the fan, transported along the radial direction of the impeller, converged through the flow channel of the fan to form a high-pressure fluid, and then discharged out through the radial outlet. When the fluid velocity is too high, the generated high-pressure fluid will easily affect the blade passing frequency to generate the noise so that the user feels bad experience. Therefore, how to solve the noise generated from the combination of the centrifugal fan and the heat conduction channel has always been a major concern in the field.

Therefore, there is a need of providing a heat dissipation assembly with a specific section area control and additive effects of relative characters for improving the performance and the noise level of the heat conduction channel thereof to obviate the drawbacks encountered by the prior arts.

SUMMARY OF THE INVENTION

An object of the present disclosure is to provide a heat dissipation assembly. A heat conduction channel formed by the heat dissipation fins is arranged at the inlet of the centrifugal fan to produce different heat dissipation effects. The heat dissipation of the heat dissipation fins in the heat conduction channel is implemented by the suction airflow of the centrifugal fan instead of the airflow from the outlet. Since the heat conduction channel is connected to the inlet of the centrifugal fan, a rectification effect is provided by the heat dissipation fins for the inlet of the centrifugal fan. Furthermore, the performance and the noise level of the heat conduction channel are further improved by controlling the cross-section areas of the heat conduction channel and the additive effects of relative characters.

Another object of the present disclosure is to provide a heat dissipation assembly. A frame is combined with the heat dissipation fins and a bottom plate to form a heat conduction channel. The rear end of the heat conduction channel is in communication with the fan and the outlet arranged at different horizontal height through the inlet disposed on the frame. The heat conduction channel arranged in front of the inlet is further combined with the characteristic diversification design of the heat dissipation fins and the cross-sectional reduction of the heat conduction channel to achieve the rectification effect. The center of the impeller of the fan and the inlet are eccentrically designed, and the hub of the impeller of the fan is further matched with the chamfered structures of the heat dissipation fins to design a diversion slope to further achieve the rectification effect. Each of the first ends of the heat dissipation fins adjacent to the airflow intake and the second ends of the heat dissipation fins adjacent to the inlet has the chamfered structure with an inclined angle, which is cooperated with the inclination of the diversion slope of the hub of the impeller. It helps to exert the rectification effect when the airflow is transported from a flow field into another one, and the turbulent energy is reduced by 15%. In addition, the height adjacent to the airflow intake is greater than the height adjacent to the inlet to form a horizontal height difference reaching 50% so that the airflow adjacent to the inlet side of the fan is inputted in a concentrated manner. Moreover, the heat conduction channel with the heat dissipation fins includes the cross-sectional areas varied in a specific ratio so that the concentration effect of the flow field is increased by 20%. On the other hand, in order to correspond to the design of different pressures, the inlet of fan is eccentrically designed relative to the center of the impeller. Furthermore, a distance from the rear end of the heat conduction channel to the center of the impeller, a width ratio of inlet to the heat conduction channel, and opening-area sizes of the outlet and the airflow intake are adjusted correspondingly at the same time so that the flow field is used effectively, and the purposes of increasing the efficiency and reducing the noise are achieved. By disposing the heat dissipation fins within the heat conduction arranged in front of the inlet, under the condition of the same fan speed, the heat dissipation performance of the heat dissipation assembly of the present disclosure is further improved by 15%, and the noise quality is improved with 10% noise reduction effect.

In accordance with an aspect of the present disclosure, a heat dissipation assembly is provided and includes a bottom plate, a plurality of fins, a frame and a fan. The bottom plate has a front end and a rear end opposite to each other. The plurality of fins are disposed on the bottom plate, spaced apart from each other, and extended in a direction from the front end to the rear end. The frame is disposed on the bottom, covers the plurality of fins, and is assembled with the bottom plate to form a heat conduction channel and an airflow intake. The airflow intake is disposed adjacent to the front end, the heat conduction channel passes through the plurality of fins, and the frame includes a first plane, a second plane and an inclined plane. The first plane is disposed adjacent to the front end and spatially corresponding to the plurality of fins, the second plane is disposed adjacent to the rear end and includes an inlet, the heat conduction channel is in communication between the airflow intake and the inlet, and the inclined plane is connected between the first plane and the second plane. A cross-section area of the heat conduction channel adjacent to the airflow intake is greater than that of the heat conduction channel adjacent to the inlet. The fan includes a top cover and an impeller. The impeller is disposed on the top cover. The top cover is spatially corresponding to the inlet, and assembled with the frame to form an outlet. The airflow intake and the heat conduction channel are in communication with the outlet through the inlet.

In an embodiment, the frame includes a guiding wall, a first lateral wall and a second lateral wall. The first lateral wall and the second lateral wall are opposite to each other and connected to two lateral sides of the first plane, respectively. The guiding wall is disposed on the first plane and connected to the first lateral wall of the frame. The guiding wall is extended along the direction from the front end to the rear end and gradually spaced apart from the first lateral wall to a constant distance.

In an embodiment, a first cross-sectional area of the heat conduction channel adjacent to the airflow intake is collaboratively formed by the first plane, the first lateral wall, the second lateral wall and the bottom plate. A second cross-sectional area of the heat conduction channel passed by the guiding wall is collaboratively formed by the first plane, the guiding wall, the second lateral wall and the bottom plate. The second cross-sectional area is ⅔ times the first cross-sectional area.

In an embodiment, a first cross-sectional area of the heat conduction channel adjacent to the airflow intake is collaboratively formed by the first plane, the first lateral wall, the second lateral wall and the bottom plate. A third cross-sectional area of the heat conduction channel adjacent to the inlet is collaboratively formed by the second plane, the guiding wall, the second lateral wall and the bottom plate. The third cross-sectional area is ½ times the first cross-sectional area.

In an embodiment, a height of the first plane relative to the bottom plate is greater than a height of the second plane relative to the bottom plate.

In an embodiment, the impeller has a blade height, which is greater than a height of the second plane relative to the bottom plate.

In an embodiment, each of the plurality of fins has a first end and a second end opposite to each other. The first end of the fin is disposed adjacent to the airflow intake and has a first chamfered structure, and the first chamfered structure forms a first inclined angle relative to a horizontal plane of the bottom plate. The second end of the fin is disposed adjacent to the inlet and has a second chamfered structure, and the second chamfered structure forms a second inclined angle relative to the horizontal plane of the bottom plate.

In an embodiment, the impeller includes a hub with a diversion slope, which forms a third inclined angle relative to the horizontal plane of the bottom plate. The third inclined angle is equal to the first inclined angle or the second inclined angle.

In an embodiment, the inlet includes a leading edge and a trailing edge, which are spatially corresponding to the front end and the rear end, respectively. A first horizontal distance is formed between a center of the impeller and the trailing edge. A second horizontal distance is formed between the center of the impeller and the leading edge. The first horizontal distance is less than 85% of the second horizontal distance.

In an embodiment, a third horizontal distance is formed between the center of the impeller and an ending of the heat conduction channel, and the third horizontal distance is less than 120% of the first horizontal distance.

In an embodiment, the airflow intake has a first width, the inlet has a second width, and the first width is greater than the second width.

In an embodiment, the airflow intake has a first opening area, the outlet has a second opening area, and the first opening area is larger than the second opening area.

In an embodiment, the frame includes a guiding wall, a first lateral wall and a second lateral wall, the first lateral wall and the second lateral wall are opposite to each other and connected to two lateral sides of the first plane, respectively, and the guiding wall is disposed on the first plane and connected to the first lateral wall of the frame. The guiding wall is extended along the direction from the front end to the rear end and gradually spaced apart from the first lateral wall.

In an embodiment, upper edges of the plurality of fins are arranged adjacent to the first plane, the inclined plane and the second plane.

In an embodiment, the airflow intake and the outlet are misaligned in view of the direction from the front end to the rear end, and have different heights relative to the bottom plate.

In accordance with an aspect of the present disclosure, a heat dissipation assembly is provided and includes a frame and a fan. The frame includes a heat conduction channel and an airflow intake. The airflow intake is disposed adjacent to one end of the frame, the heat conduction channel is communication with an exterior through airflow intake, and the frame includes a first plane, a second plane and an inclined plane. The first plane is disposed adjacent to the airflow intake, the inclined plane is connected between the first plane and the second plane, the second plane includes an inlet, and the heat conduction channel is in communication between the airflow intake and the inlet. A cross-section area of the heat conduction channel adjacent to the airflow intake is greater than that of the heat conduction channel adjacent to the inlet. The fan includes a top cover and an impeller. The impeller is disposed on the top cover. The top cover is spatially corresponding to the inlet, and assembled with the frame to form an outlet. The airflow intake and the heat conduction channel are in communication with the outlet through the inlet.

In an embodiment, the inclined plane is in an arc shape relative to the inlet.

In an embodiment, an airflow from the airflow intake to the inlet through the heat conduction channel and an airflow from the inlet to the outlet are located on different levels.

In an embodiment, the airflow intake and the outlet are located on different sides of the frame, respectively.

In an embodiment, the airflow intake and the outlet are located on different sides of the inlet, respectively.

BRIEF DESCRIPTION OF THE DRAWINGS

The above contents of the present disclosure will become more readily apparent to those ordinarily skilled in the art after reviewing the following detailed description and accompanying drawings, in which:

FIG. 4 is a transverse cross-section view illustrating the heat dissipation assembly and taken at a first cross section;

DETAILED DESCRIPTION OF THE PREFERRED EMBODIMENT

Figure 1:
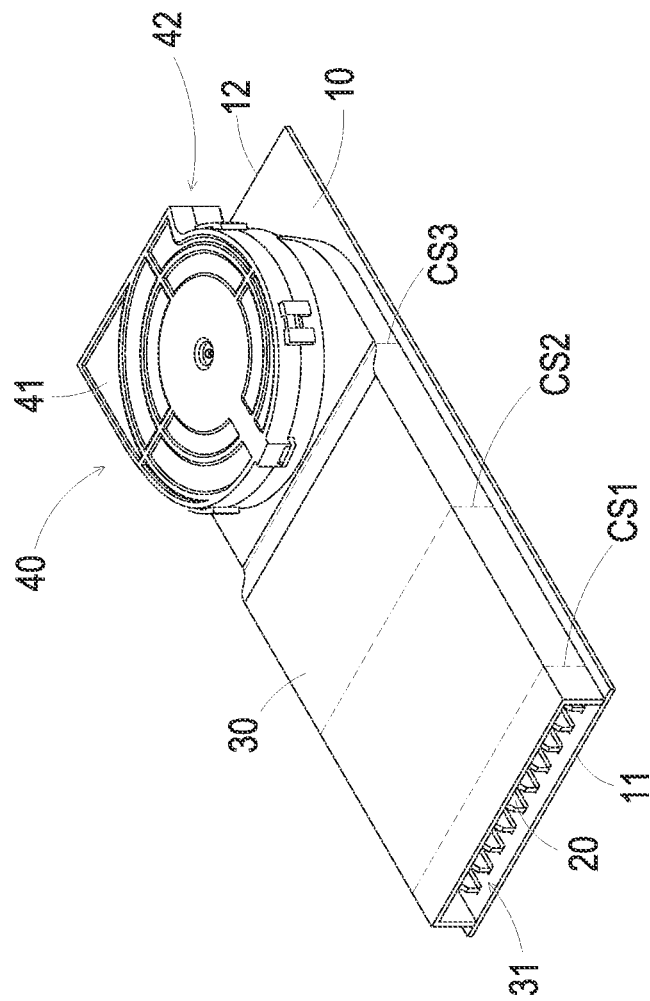
FIG. 1 is a perspective view illustrating a heat dissipation assembly according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "front", "rear", "top", "bottom", "upper" "lower" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected", or "coupled", to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

FIG. 1 is a perspective view illustrating a heat dissipation assembly according to a first embodiment of the present disclosure. As shown in FIG. 1, a heat dissipation assembly 1 is provided and includes a bottom plate 10, a plurality of fins 20, a frame 30 and a fan 40. The bottom plate 10 has a front end 11 and a rear end 12 opposite to each other. The plurality of fins 20 are disposed on the bottom plate 10, spaced apart from each other and extend in a direction from the front end 11 to the rear end 12. The frame 30 is disposed on the bottom plate 10. The frame 30 covers the plurality of fins 20, and the frame 30 is assembled with the bottom plate 10 to form an airflow intake 31. The airflow intake 31 is disposed adjacent to the front end 11. The fan 40 is disposed on the frame 30. The fan 40 includes a top cover 41 assembled with the frame 30 to form an outlet 42. The plurality of fins 20 are thermally coupled to a heat-generating element (not shown) through the bottom plate 10 for heat dissipation. The required cooling airflow is inhaled through the airflow intake 31 by the fan 40, and the airflow passing through the plurality of fins 20 is discharged through the outlet 42 of the fan 40. That is, the airflow passes through the plurality of fins 20 first and then discharges through the fan 40. Preferably but not exclusively, the fan 40 is a centrifugal fan. In order to make the inhaled airflow act on the plurality of fins 20, the airflow intake 31 and the outlet 42 are misaligned in view of the direction from the front end 11 to the rear end 12, and have different heights relative to the bottom plate 10.

It should be noted that, in all the embodiments of the disclosure, the front end 11 and the rear end 12 are not limited to a cross section, respectively. That is, the bottom plate 10 can be a larger extended plane, and only one area is provided with the plurality of fins 20, which are covered by the frame 30. For example, the bottom plate 10 can be a part of the metal shell of heat-generating device.

Figure 2:
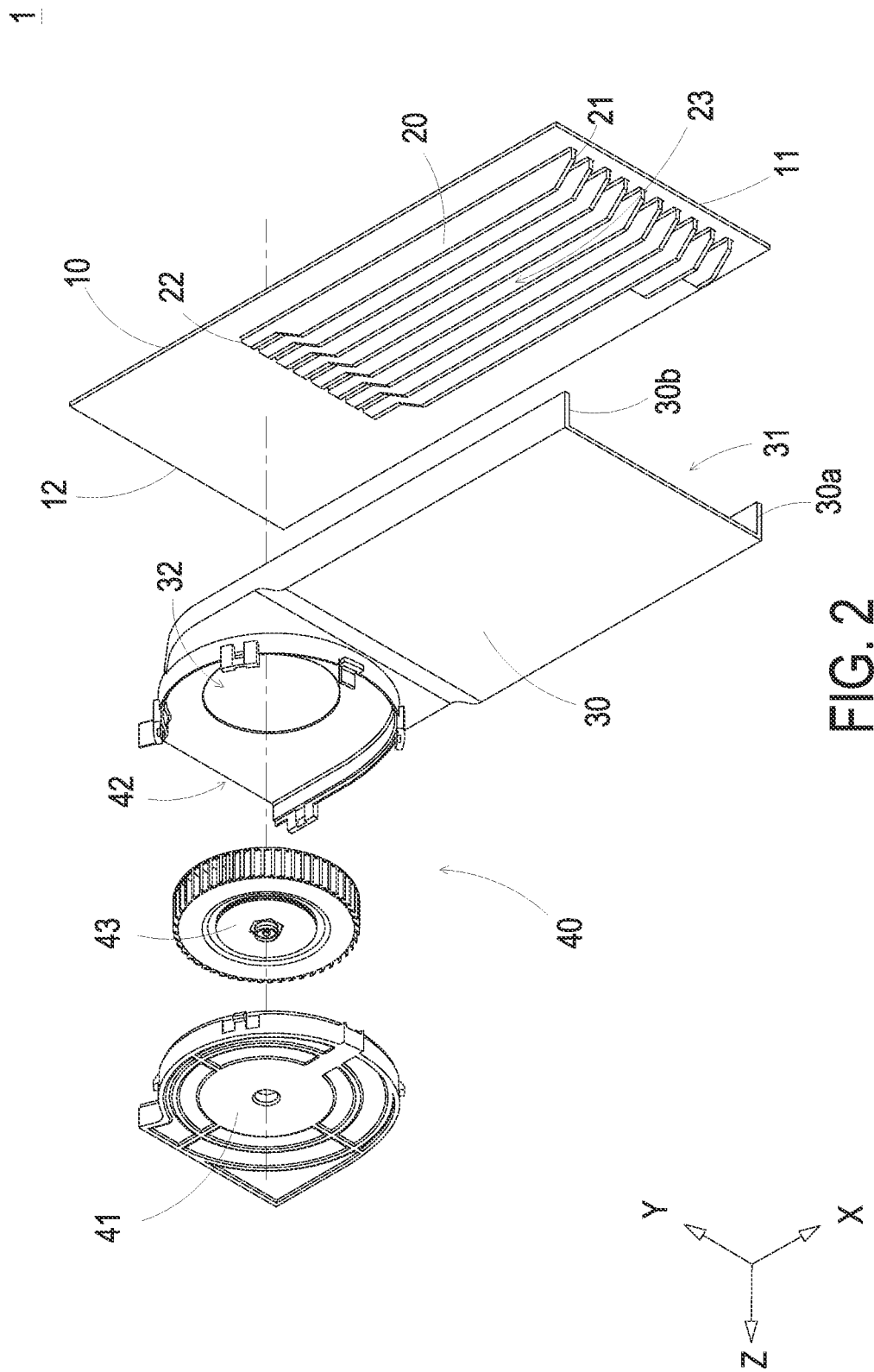
FIG. 2 is an exploded view illustrating the heat dissipation assembly according to the first embodiment of the present disclosure.

FIG. 2 is an exploded view illustrating the heat dissipation assembly according to the first embodiment of the present disclosure. As shown in FIG. 2, the frame 30 is disposed on the bottom plate 10 and covers the plurality of fins 20. The frame 30 includes a first lateral wall 30a and a second lateral wall 30b, which are assembled with the bottom plate 10 to form a heat conduction channel 23. The heat conduction channel 23 is in communication with an exterior through the airflow intake 31 and extended in the direction from the front end 11 to the rear end 12 so that airflow passes through first ends 21 and second ends 22 of the plurality of fins 20. The frame 30 includes an inlet 31 passing through the frame 30 and in communication with the heat conduction channel 23. The fan 40 includes a top cover 41 and an impeller 43. The impeller 43 is disposed on the top cover 41. The top cover 41 is spatially corresponding to the inlet 32, and assembled with the frame 30 to form the outlet 42. The airflow intake 31 and the heat conduction channel 23 are in communication with the outlet 42 through the inlet 32.

Figure 3:
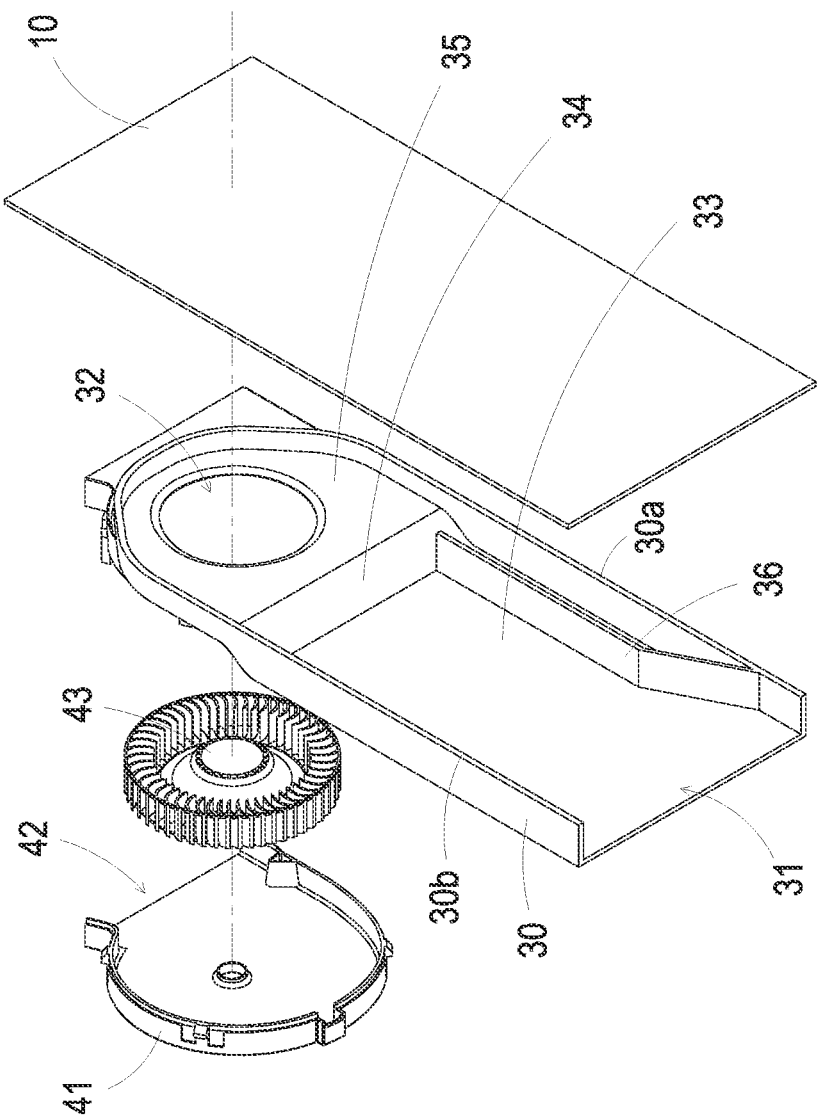
FIG. 3 is an exploded view illustrating the heat dissipation assembly according to the first embodiment of the present disclosure and taken from another perspective.

FIG. 3 is an exploded view illustrating the heat dissipation assembly according to the first embodiment of the present disclosure and taken from another perspective. As shown in FIG. 3, the frame 30 includes a first plane 33, a second plane 35 and an inclined plane 34. The first plane 33 is disposed adjacent to the front end 11 and spatially corresponding to the plurality of fins 20. The second plane 35 is disposed adjacent to the rear end 12 and includes the inlet 32 disposed thereon. The heat conduction channel 23 formed by assembling the frame 30 and the bottom plate 10 is in communication between the airflow intake 31 and the inlet 32. In addition, the inclined plane 34 is connected between the first plane 33 and the second plane 35. The frame 30 further includes a guiding wall 36 disposed between the first lateral wall 30a and the second lateral wall 30b. The first lateral wall 30a and the second lateral wall 30b are opposite to each other and connected to two lateral sides of the first plane 33, the inclined plane 34 and the second plane 35, respectively. Preferably but not exclusively, the guiding wall 36 is at least disposed on the first plane 33 and connected to the first lateral wall 30a of the frame 30. Moreover, the guiding wall 36 is extended along the direction from the front end 11 to the rear end 12 and gradually spaced apart from the first lateral wall 30a to a constant distance. In other words, the guiding wall 36 is designed to include two sections. For example, the front section is designed to be constricted relative to the second lateral wall 30b, and the rear section is designed to be parallel to the second lateral wall 30b. In other embodiment, the rear section of the guiding wall 36 is further extended to the inclined plane 34 and the second plane 35, and adjacent to the peripheral edge of the inlet 32. Certainly, the present disclosure is not limited thereto. Notably, with the design of the guiding wall 36, a cross-section area of the heat conduction channel 23 adjacent to the airflow intake 31 is greater than that of the heat conduction channel 23 adjacent to the inlet 32. It helps to exert the rectification effect of channel compression when the airflow passes through the heat conduction channel 23.

FIG. 4 is a transverse cross-section view illustrating the heat dissipation assembly and taken at a first cross section. Referring to FIGS. 1 and 4, the heat conduction channel 23 has a first cross section CS1 adjacent to the airflow intake 31. A first cross-sectional area 51 of the heat conduction channel 23 at the first cross section CS1 and adjacent to the airflow intake 31 is collaboratively formed by the first plane 33, the first lateral wall 30a, the second lateral wall 30b and the bottom plate 10.

Figure 5:
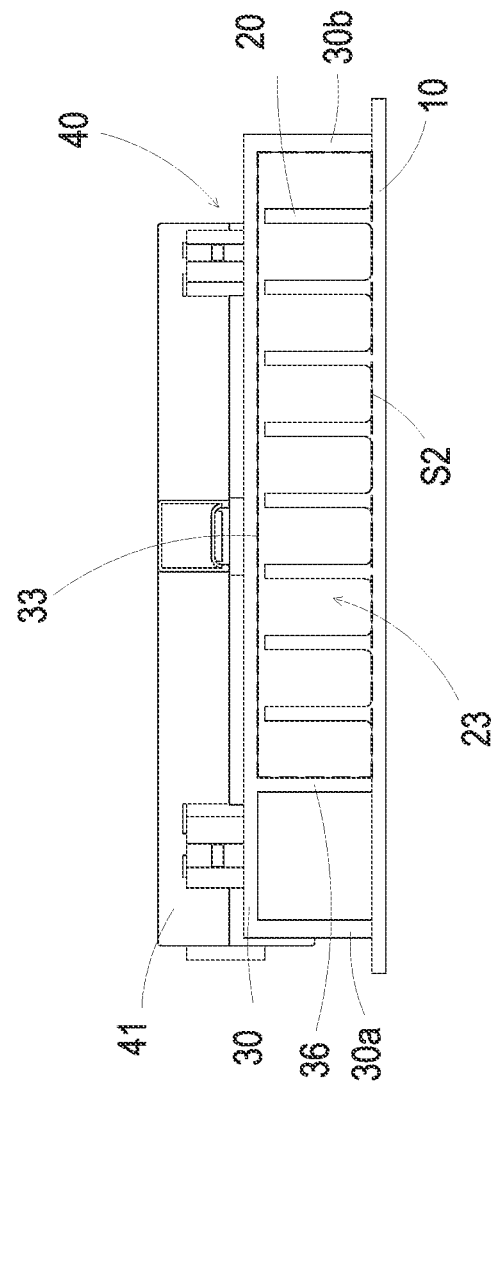
FIG. 5 is a transverse cross-section view illustrating the heat dissipation assembly and taken at a second cross section.
Figure 6:
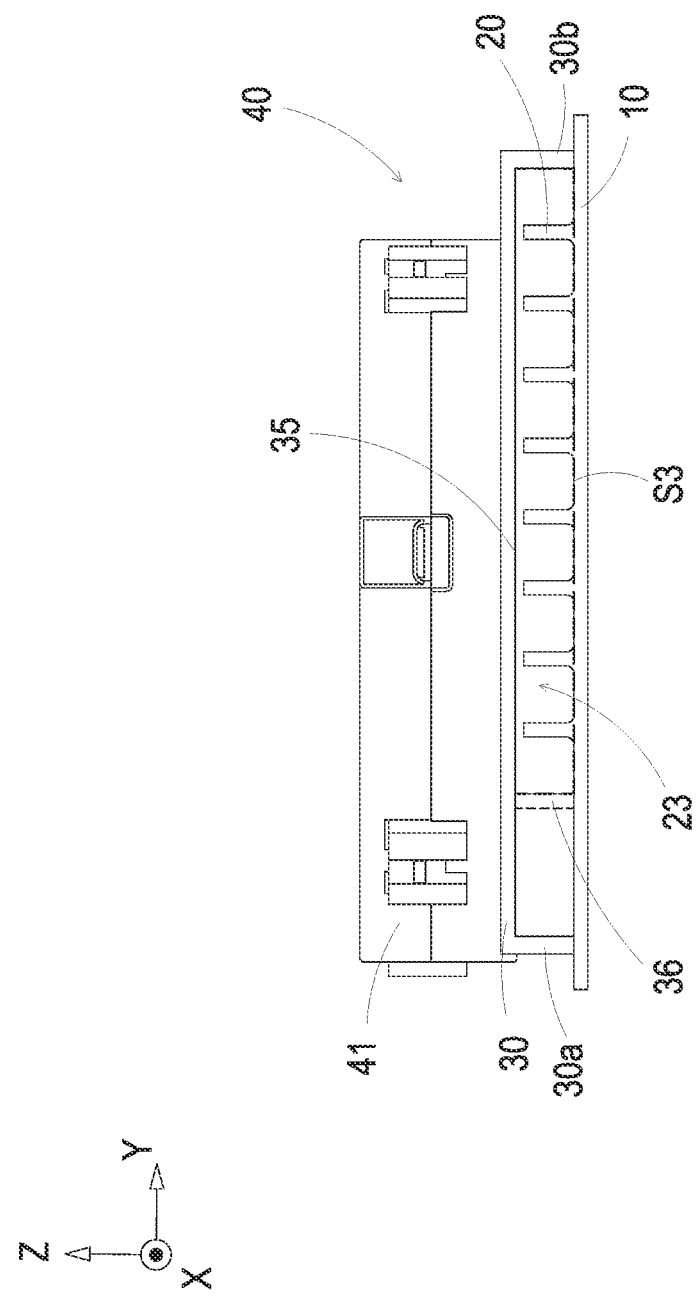
FIG. 6 is a transverse cross-section view illustrating the heat dissipation assembly and taken at a third cross section.
Figure 7:
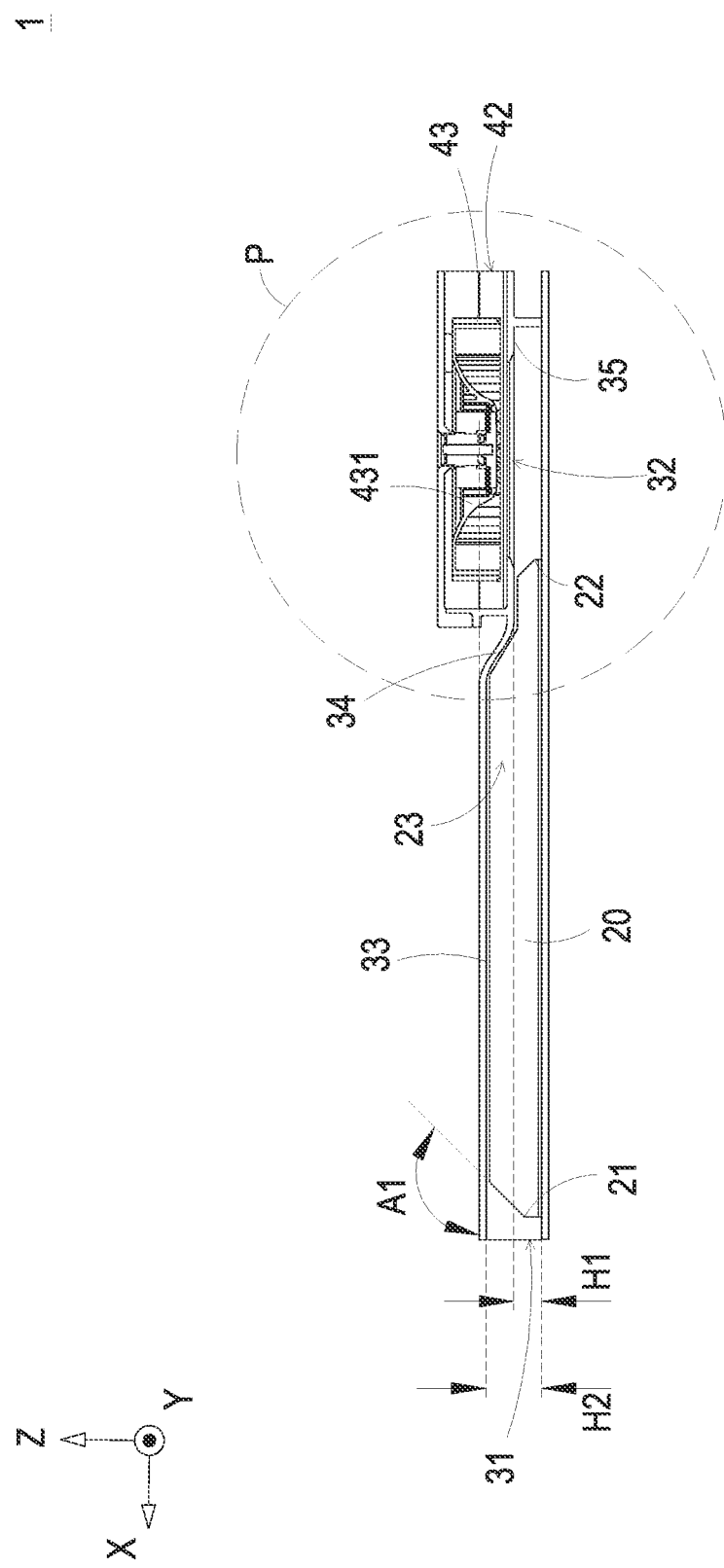
FIG. 7 is a longitudinal cross-sectional view illustrating the heat dissipation assembly of FIG. 1.

FIG. 5 is a transverse cross-section view illustrating the heat dissipation assembly and taken at a second cross section. Referring to FIGS. 1 and 5, the second cross section CS2 substantially disposed at the middle of the heat conduction channel 23. A second cross-sectional area S2 at the second cross section CS2 is collaboratively formed by the first plane 33, the guiding wall 36, the second lateral wall 30b, and the bottom plate 10. Referring to FIGS. 4 and 5, the second cross-sectional area S2 is ⅔ times the first cross-sectional area 51. In this way, the front section of the heat conduction channel 23 can optimize the rectification effect of channel compression FIG. 6 is a transverse cross-section view illustrating the heat dissipation assembly and taken at a third cross section. Referring to FIGS. 1 and 6, the heat conduction channel 23 has a third cross section CS3 disposed adjacent to the inlet 32. A third cross-sectional area S3 of the heat conduction channel 23 adjacent to the inlet 32 is collaboratively formed by the second plane 35, the guiding wall 36, the second lateral wall 30b and the bottom plate 10. Referring to FIGS. 4 and 6, the third cross-sectional area S3 is ½ times the first cross-sectional area S1. In this way, the rear section of the heat conduction channel 23 can optimize the rectification effect of channel compression FIG. 7 is a longitudinal cross-sectional view illustrating the heat dissipation assembly of FIG. 1. As shown in FIG. 7, a height H2 of the first plane 33 relative to the bottom plate 10 is greater than a height H1 of the second plane 35 relative to the bottom plate 10. In other words, the first plane 33 is connected to the second plane 35 through the inclined plane 34, and the height of the heat conduction channel 23 is lowered, so that the cross-sectional area adjacent to the airflow intake 31 is greater than that of the heat conduction channel 23 adjacent to the inlet 32. It helps to exert the rectification effect of channel compression when the airflow passes through the heat conduction channel 23. The upper edges of the plurality of fins 20 are arranged adjacent to the first plane 33, the inclined plane 34 and the second plane 35. It facilitates the airflow to act on the plurality of fins 20 effectively and enhance the efficacy of heat dissipation when the airflow flows through the heat conduction channel 23. Moreover, each of the plurality of fins 20 has a first end 21 and a second end 22 opposite to each other. The first end 21 of the fin 20 is disposed adjacent to the airflow intake 31 and has a first chamfered structure, and the first chamfered structure forms a first inclined angle A1 relative to a horizontal plane of the bottom plate 10. With the design of the diversion inclined angle of the fins 20 adjacent to the airflow intake 31, it helps to exert the rectification effect when the airflow is transported from the airflow intake 31 into the head conduction channel 23. In addition, the airflow intake 31 and the outlet 42 are misaligned in view of the direction from the front end 11 to the rear end 12 and have different heights relative to the bottom plate 10. The height difference between the height adjacent to the airflow intake 31 and the height adjacent to the inlet 32 can reach 50% so that the airflow at the side of the inlet 32 of the fan 40 is converged to input. By collaborating with adjustment of the cross-sectional area of the heat conduction channel 23 in a specific ratio with the plurality of fins 20 disposed therein, as shown in FIGS. 4 to 6, the concentration effect of the flow field is enhanced to increase the performance output by 20%.

Figure 8:
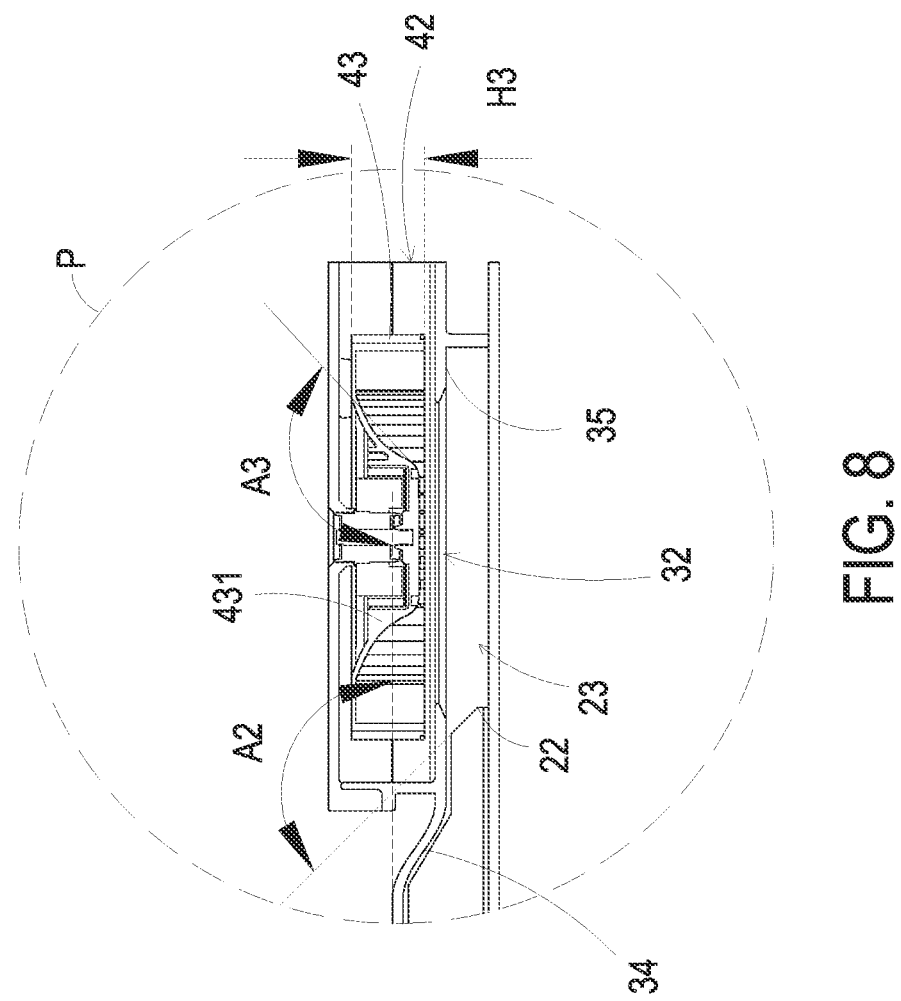
FIG. 8 is an enlarged view showing the region P in FIG. 7.

FIG. 8 is an enlarged view showing the region P in FIG. 7. As shown in FIG. 8, the impeller 43 has a blade height H3, which is greater than the height H1 of the second plane 35 relative to the bottom plate 10. The second end 22 of the fin 20 is disposed adjacent to the inlet 32 and has a second chamfered structure, and the second chamfered structure forms a second inclined angle A2 relative to the horizontal plane of the bottom plate 10. The impeller 43 includes a hub 431 with a diversion slope, which forms a third inclined angle A3 relative to the horizontal plane of the bottom plate 10. Preferably but not exclusively, the third inclined angle A3 is equal to the first inclined angle A1 or the second inclined angle A2. The inclination of the diversion slope of the hub 431 of the impeller 43 is further cooperated with the chamfered structures of the fins 20 to achieve the effect of rectification. When the first chamfered structures of the fins 20 located at the first ends 21 adjacent to the airflow intake 31 and the second chamfered structures of the fins 20 located at the second ends 22 adjacent to the inlet 32 are cooperated with the inclination of the diversion slope of the hub 431 of the impeller 43, the rectification effect of the transported airflow will be exerted, and the turbulent energy is reduced by 15%.

Figure 9:
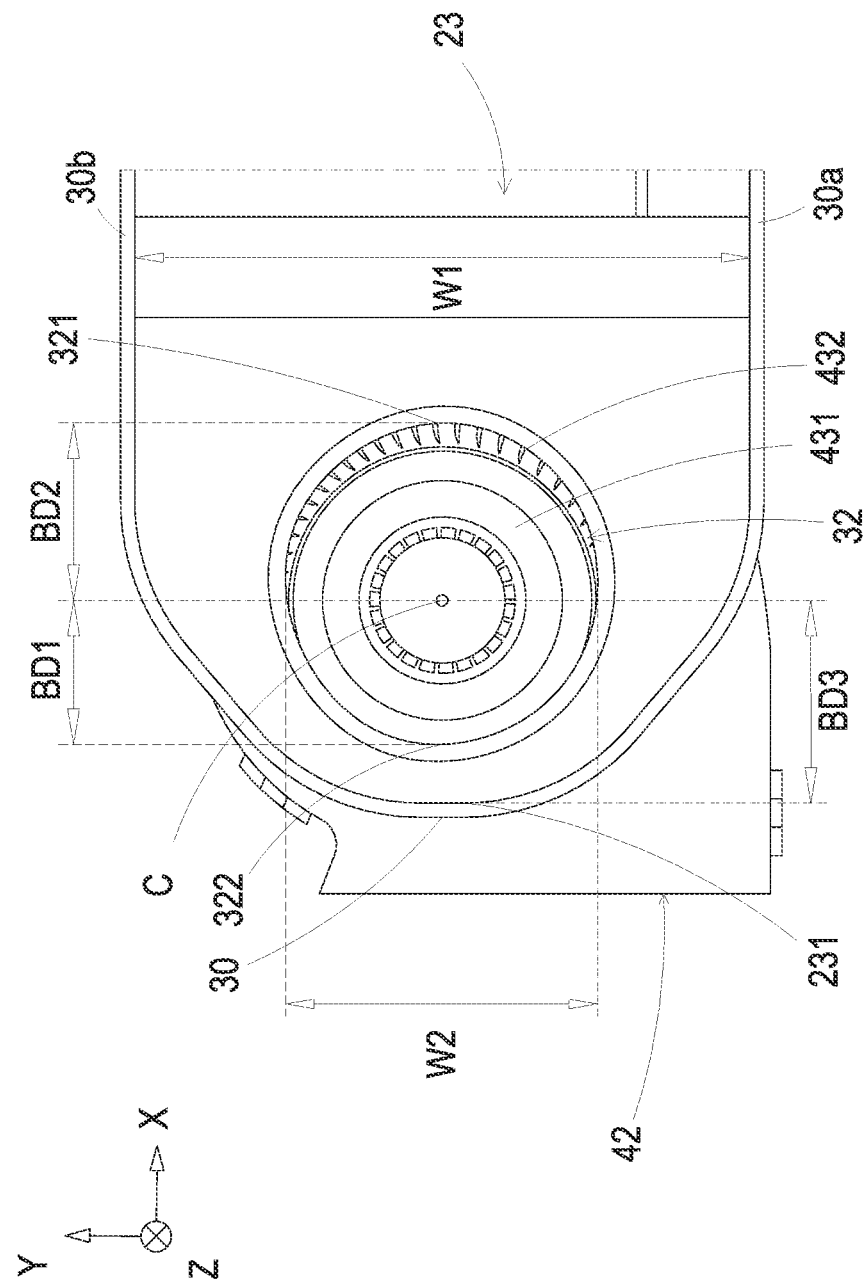
FIG. 9 is a schematic diagram illustrating the corresponding relationship between the dimensions of each component in the heat dissipation assembly according to the first embodiment of the present disclosure.

FIG. 9 is a schematic diagram illustrating the corresponding relationship between the dimensions of each component in the heat dissipation assembly according to the first embodiment of the present disclosure. In order to correspond to the design of different pressures, the inlet 32 is eccentrically designed relative to the center C of the impeller 43. Preferably but not exclusively, the inlet 32 is offset in the X axial direction with respect to the hub 431 and the blade 432 of the impeller 43. The inlet 32 includes a leading edge 321 and a trailing edge 322, which are spatially corresponding to the front end 11 and the rear end 12 in the X axial direction, respectively. A first horizontal distance BD1 is formed between the center C of the impeller 43 and the trailing edge 322 in the X axial direction. A second horizontal distance BD2 is formed between the center C of the impeller 43 and the leading edge 321 in the X axial direction. Preferably but not exclusively, the first horizontal distance BD1 is less than 85% of the second horizontal distance BD2. Preferably but not exclusively, a third horizontal distance BD3 is formed between the center C of the impeller 43 and an ending 231 of the heat conduction channel 23 in the X axial direction, and the third horizontal distance BD3 is less than 120% of the first horizontal distance BD1. The airflow intake 31 has a first width W1 in the Y axial direction, the inlet 32 has a second width W2 in the Y axial direction, and the first width W1 is greater than the second width W2. Accordingly, in the heat dissipation assembly 1 of the present disclosure, the inlet 32 is eccentrically designed relative to the center C of the impeller 43, the distance from the ending 231 of the heat conduction channel 23 to the center C of the impeller 43 and the width ratio of inlet 32 relative to the heat conduction channel 23 are adjusted at the same time so that the flow field is used effectively, and the purposes of increasing efficiency and reducing noise are achieved at the same time. Certainly, the present disclosure is not limited thereto.

Figure 10:
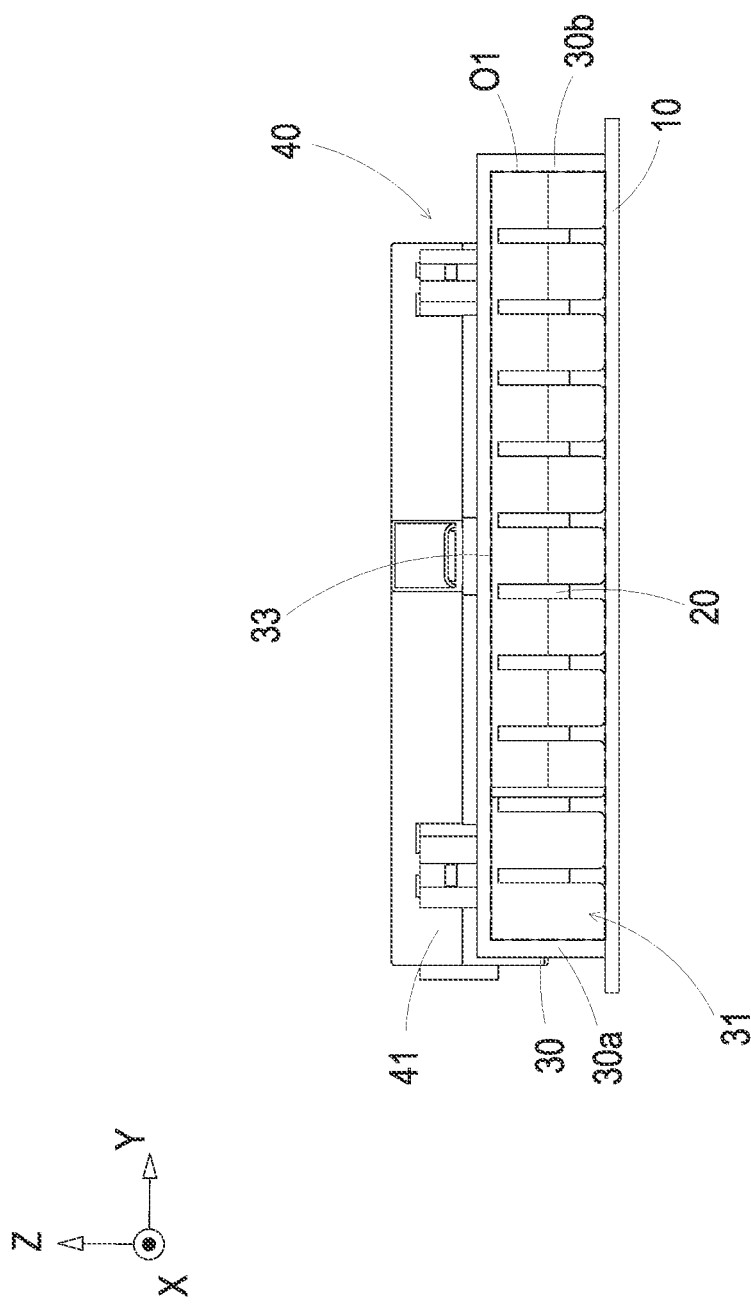
FIG. 10 is a front view illustrating the heat dissipation assembly according to the first embodiment of the present disclosure.
Figure 11:
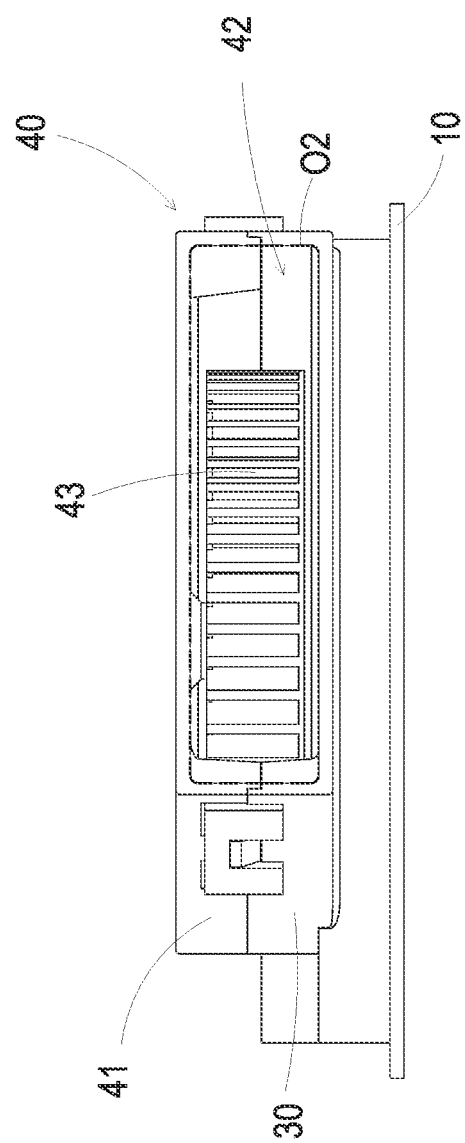
FIG. 11 is a rear view illustrating the heat dissipation assembly according to the first embodiment of the present disclosure.

FIG. 10 is a front view illustrating the heat dissipation assembly according to the first embodiment of the present disclosure. As shown in FIG. 10, the airflow intake 31 has a first opening area O1. FIG. 11 is a rear view illustrating the heat dissipation assembly according to the first embodiment of the present disclosure. As shown in FIG. 11, the outlet 42 has a second opening area O2. Referring to FIGS. 10 and 11, the first opening area O1 is larger than the second opening area O2. By adjusting the opening-area sizes of the outlet 42 relative to the airflow intake 31 correspondingly, the flow field is used effectively, and the purposes of increasing the efficiency and reducing the noise are achieved.

Figure 12:
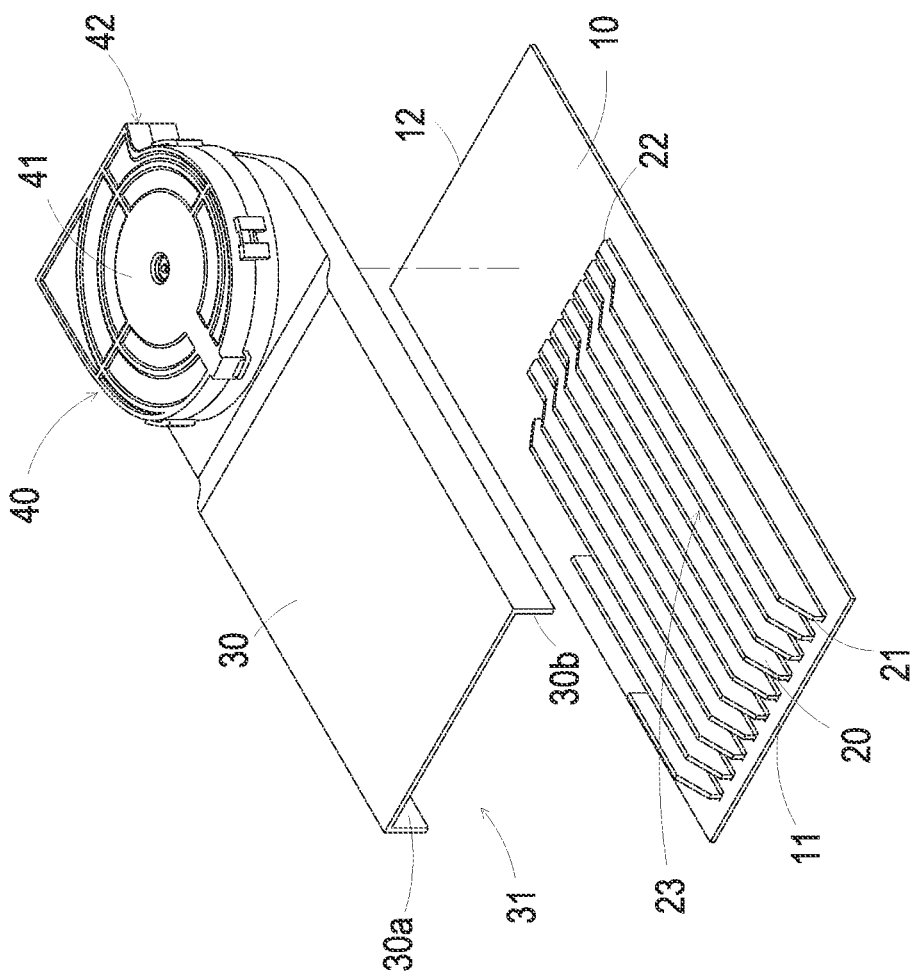
FIG. 12 is an exploded view illustrating a heat dissipation assembly according to a second embodiment of the present disclosure.

FIG. 12 is an exploded view illustrating a heat dissipation assembly according to a second embodiment of the present disclosure. As shown in FIG. 12, the structures, elements and functions of the heat dissipation assembly 1a are similar to those of the heat dissipation assembly 1 of FIGS. 1 to 11, and are not redundantly described herein. In the embodiment, the plurality of fins 20 have different extension lengths extending along the direction from the front end 11 to the rear end 12, and are spaced apart from each other and disposed on the bottom plate 10. In that, the frame 30 is connected to bottom plate 10 through the first lateral wall 30a and the second lateral wall 30b to form the heat conduction channel 23. The plurality of fins 20 disposed within the heat conduction channel 23 are thermally coupled to the heat-generating element (not shown) through the bottom plate 10 for heat dissipation. The required cooling airflow for the fins 20 is inhaled through the airflow intake 31 by the fan 40, and then the airflow passing through the plurality of fins 20 is discharged through the outlet 42 of the fan 40.

Figure 13:
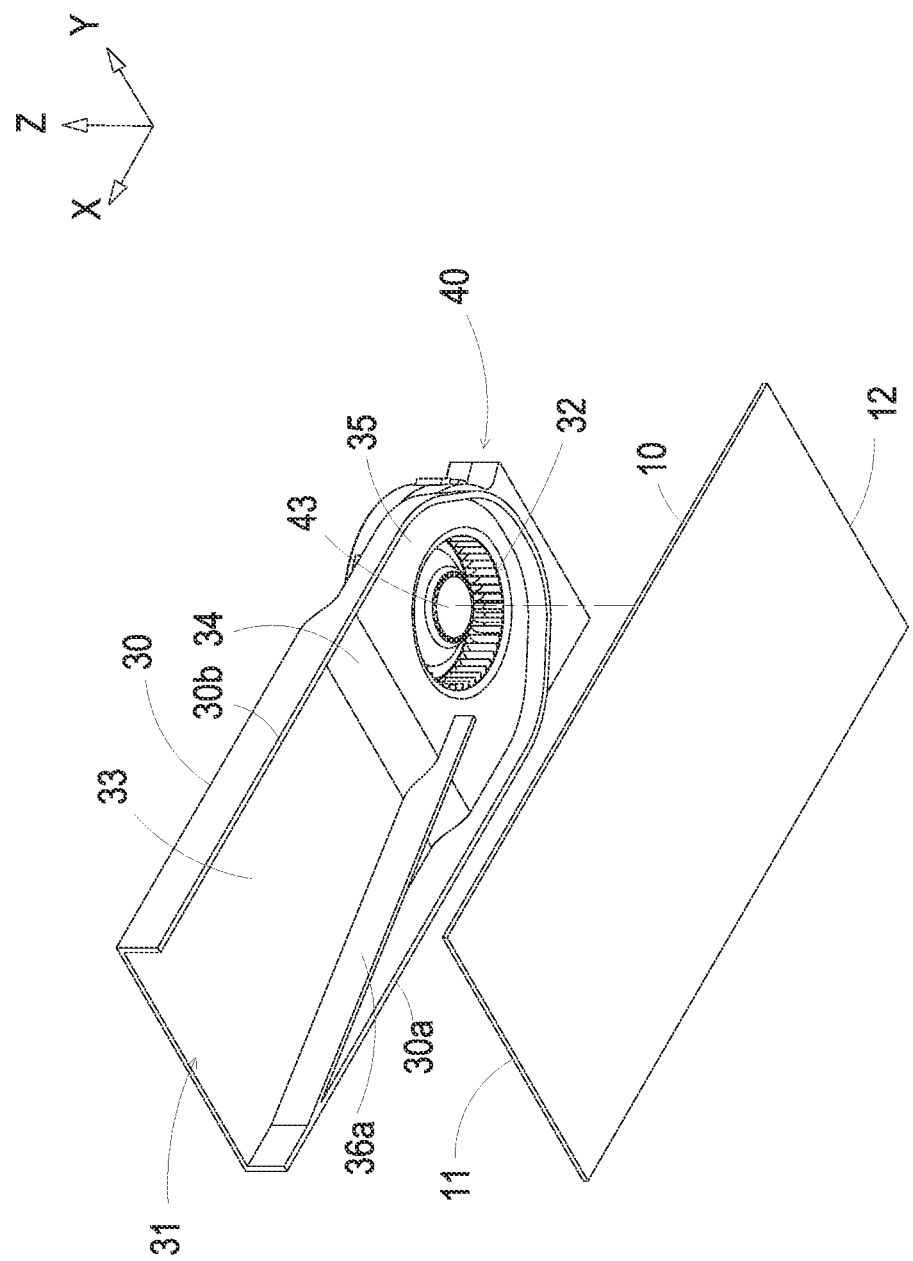
FIG. 13 is an exploded view illustrating the heat dissipation assembly according to the second embodiment of the present disclosure and taken from another perspective.

FIG. 13 is an exploded view illustrating the heat dissipation assembly according to the second embodiment of the present disclosure and taken from another perspective. As shown in FIG. 13, the frame 30 includes a first plane 33, a second plane 35 and an inclined plane 34. The first plane 33 is disposed adjacent to the front end 11 and spatially corresponding to the plurality of fins 20. The second plane 35 is disposed adjacent to the rear end 12 and includes the inlet 32 disposed thereon. The heat conduction channel 23 formed by assembling the frame 30 and the bottom plate 10 is in communication between the airflow intake 31 and the inlet 32. In addition, the inclined plane 34 is connected between the first plane 33 and the second plane 35. The frame 30 further includes a guiding wall 36a, a first lateral wall 30a and a second lateral wall 30b. The first lateral wall 30a and the second lateral wall 30b are opposite to each other and connected to two lateral sides of the first plane 33, the inclined plane 34 and the second plane 35, respectively. Preferably but not exclusively, the guiding wall 36a is connected to the first lateral wall 30a of the frame 30, extended along the direction from the front end 11 to the rear end 12 and gradually spaced apart from the first lateral wall 30a. Preferably but not exclusively, the ending of the guiding wall 36a is disposed adjacent to the peripheral edge of the inlet 32. Certainly, the present disclosure is not limited thereto. Notably, with the design of the guiding wall 36a and the connection of the first plane 33, the inclined plane 34 and the second plane 35, a cross-section area of the heat conduction channel 23 adjacent to the airflow intake 31 is greater than that of the heat conduction channel 23 adjacent to the inlet 32. It helps to exert the rectification effect of channel compression when the airflow passes through the heat conduction channel 23.

Figure 14:
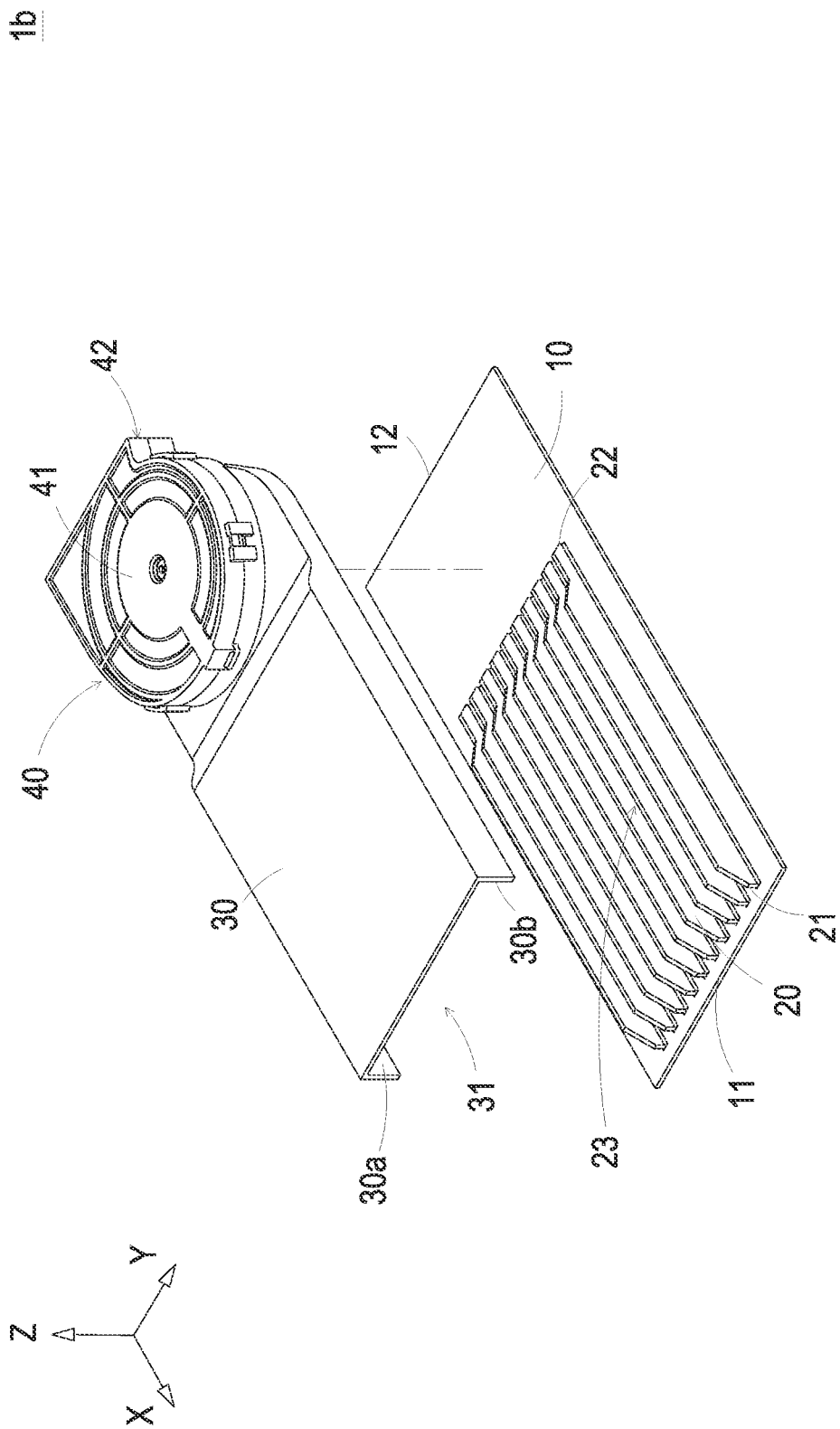
FIG. 14 is an exploded view illustrating a heat dissipation assembly according to a third embodiment of the present disclosure.

FIG. 14 is an exploded view illustrating a heat dissipation assembly according to a third embodiment of the present disclosure. As shown in FIG. 14, the structures, elements and functions of the heat dissipation assembly 1b are similar to those of the heat dissipation assembly 1 of FIGS. 1 to 11, and are not redundantly described herein. The plurality of fins 20 have an identical extension length extending along the direction from the front end 11 to the rear end 12, and are spaced apart from each other and disposed on the bottom plate 10. In that, the frame 30 is connected to bottom plate 10 through the first lateral wall 30a and the second lateral wall 30b to form the heat conduction channel 23. Notably, the plurality of fins 20 in the present disclosure are accommodated within the heat conduction channel 23 and arranged in front of inlet 32 of the fan 40. Therefore, the heat dissipation of the plurality of fins 20 accommodated within the heat conduction channel 23 is affected by the intaking airflow of the fan 40 instead of the exhaust airflow of the fan 40. Different from the conventional duct design without fins arranged in front of inlet of the fan, the plurality of fins 20 in the present disclosure are accommodated within the heat conduction channel 23 and arranged in front of the inlet 32. Under the condition of the same fan speed, the heat dissipation performance of the heat dissipation assembly 1 of the present disclosure is further improved by 15%, and the noise quality is improved with 10% noise reduction effect.

Figure 15:
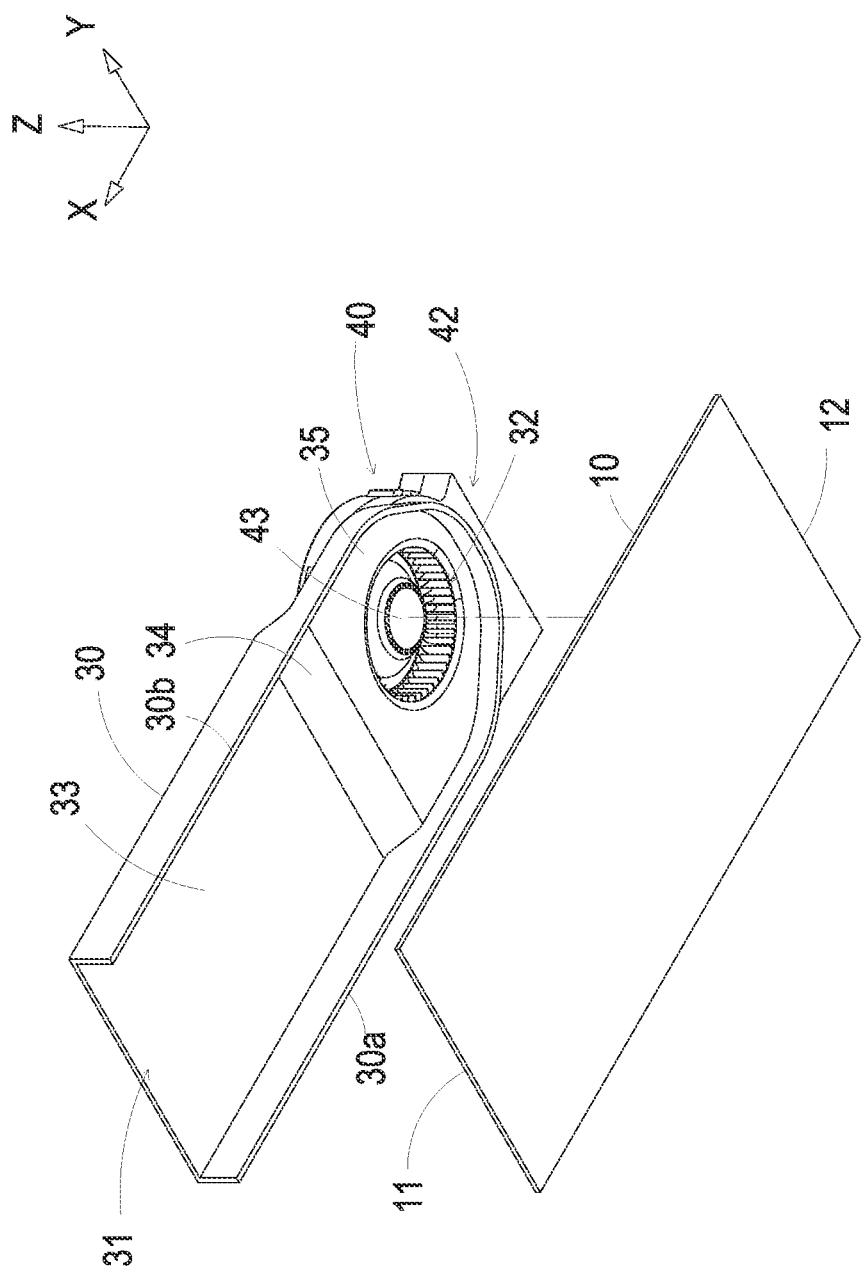
FIG. 15 is an exploded view illustrating the heat dissipation assembly according to the third embodiment of the present disclosure and taken from another perspective.

FIG. 15 is an exploded view illustrating the heat dissipation assembly according to the third embodiment of the present disclosure and taken from another perspective. As shown in FIG. 15, the frame 30 includes a first plane 33, a second plane 35 and an inclined plane 34. The first plane 33 is disposed adjacent to the front end 11 and spatially corresponding to the plurality of fins 20. The second plane 35 is disposed adjacent to the rear end 12, the inclined plane 34 is connected between the first plane 33 and the second plane 35, and the inlet 32 is disposed on the second plane 35. Compared with the foregoing embodiments, the foregoing guiding walls 36 and 36a are omitted in FIG. 15. In the embodiment, the frame 30 is connected to the bottom plate 10 through the first lateral wall 30a and the second lateral wall 30b. With the height difference between the first plane 33 and the second plane 35, a cross-section area of the heat conduction channel 23 adjacent to the airflow intake 31 is greater than that of the heat conduction channel 23 adjacent to the inlet 32. It helps to exert the rectification effect of channel compression when the airflow passes through the heat conduction channel 23. Certainly, the present disclosure is not limited thereto.

Figure 16:
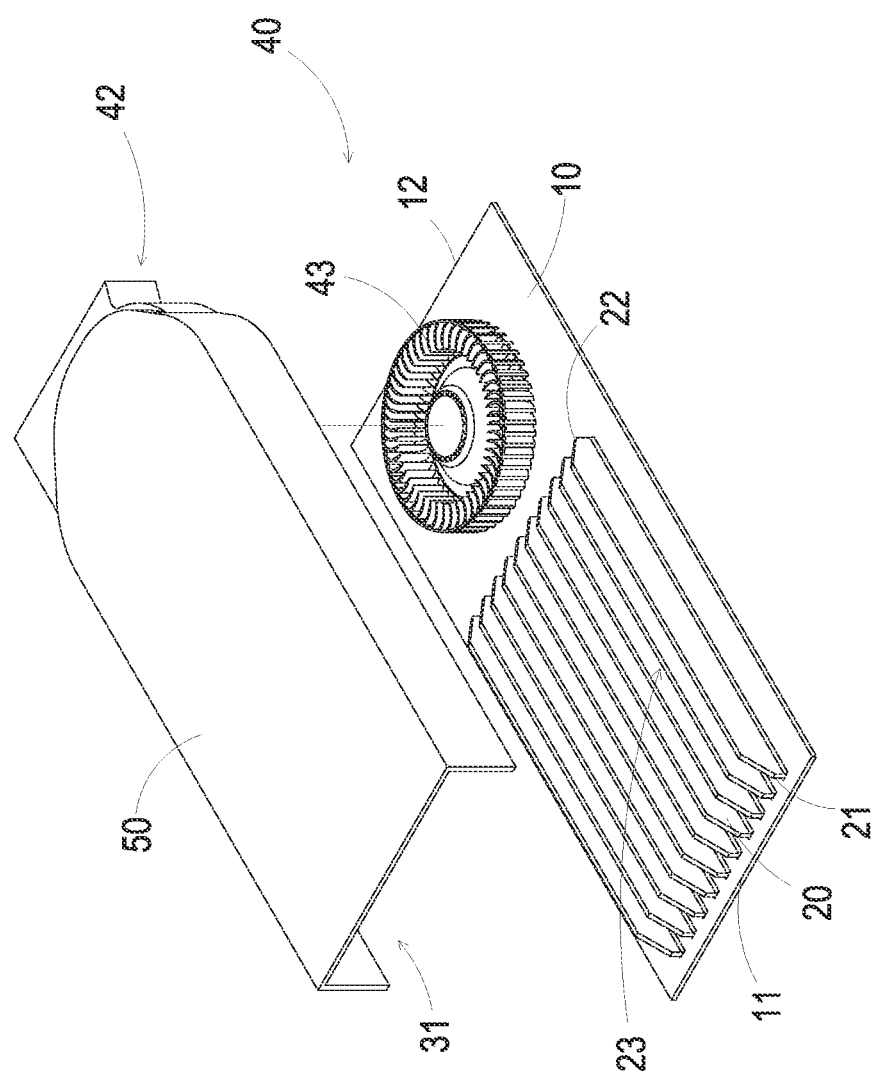
FIG. 16 is an exploded view illustrating a heat dissipation assembly according to a fourth embodiment of the present disclosure.

FIG. 16 is an exploded view illustrating a heat dissipation assembly according to a fourth embodiment of the present disclosure. In the embodiment, the structures, elements and functions of the heat dissipation assembly 1c are similar to those of the heat dissipation assembly 1 of FIGS. 1 to 11, and are not redundantly described herein. As shown in FIG. 16, the plurality of fins 20 with an identical extension length are disposed on the bottom plate 10, spaced apart from each other and extended along the direction from the front end 11 to the rear end 12. The impeller 43 is disposed on the bottom plate 10 and located adjacent to the rear end 12 of the bottom plate 10. The frame 50 is disposed on the bottom plate 10, and covers the plurality of fins 20 and the impeller 43. When the frame 50 is assembled with the bottom plate 10, an airflow intake 31 is formed by the frame 50 and the front end 11 of the bottom plate 10 and located adjacent to the front end 11 of the bottom plate 10. Moreover, an outlet 42 is formed by the frame 50 and the rear end 12 of the bottom plate 10 and located adjacent to the rear end 12 of the bottom plate 10. In the embodiment, the plurality of fins 20 are thermally coupled to a heat-generating element (not shown) through the bottom plate 10 for heat dissipation. The required cooling airflow is inhaled through the airflow intake 31, and then the airflow passing through the plurality of fins 20 is discharged through the outlet 42.

Figure 17:
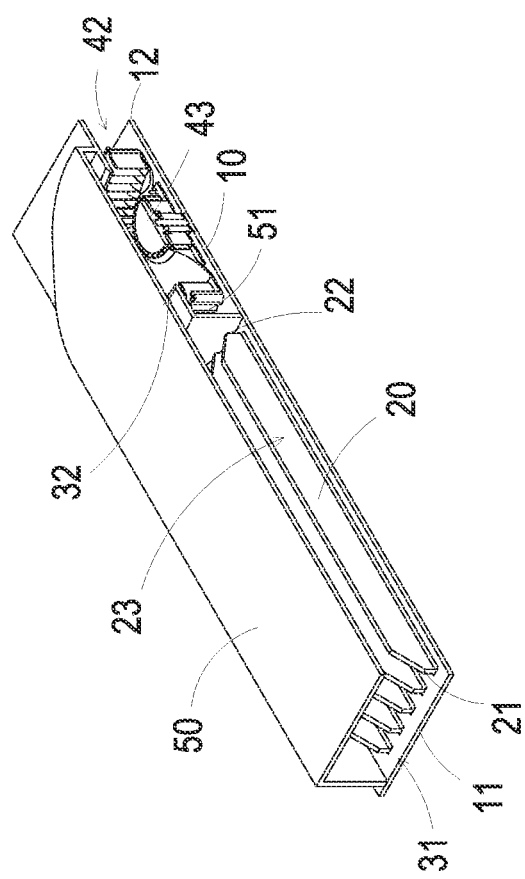
FIG. 17 is a longitudinal cross-sectional view illustrating the heat dissipation assembly according to the fourth embodiment of the present disclosure.

FIG. 17 is a longitudinal cross-sectional view illustrating the heat dissipation assembly according to the fourth embodiment of the present disclosure. As shown in FIG. 17, the frame 50 further includes an inner cover 51. The inner cover 51 includes an inlet 32, which is spatially corresponding to the impeller 43. When the frame 50 is assembled with the bottom plate 10, the inner cover 51 of the frame 50 covers the impeller 43, and the heat conduction channel 23 is in communication with the outlet 42 through the inlet 32. In the embodiment, the heat conduction channel 23 is further divided into two sections. One section with the plurality of fins 20 arranged thereon is formed by the bottom plate 10 and the top plane of the frame 50, and another section adjacent to the inlet 32 is by the inner cover 51 and the top plane of the frame. Since the height distance between the bottom plate 10 and the top plane of the frame 50 is greater than the height distance between the inner cover 51 and the top plane of the frame 50, a cross-section area of the heat conduction channel 23 adjacent to the airflow intake 31 is greater than that of the heat conduction channel 23 adjacent to the inlet 32. It helps to exert the rectification effect of channel compression when the airflow passes through the heat conduction channel 23. Certainly, the present disclosure is not limited thereto.

Figure 18:
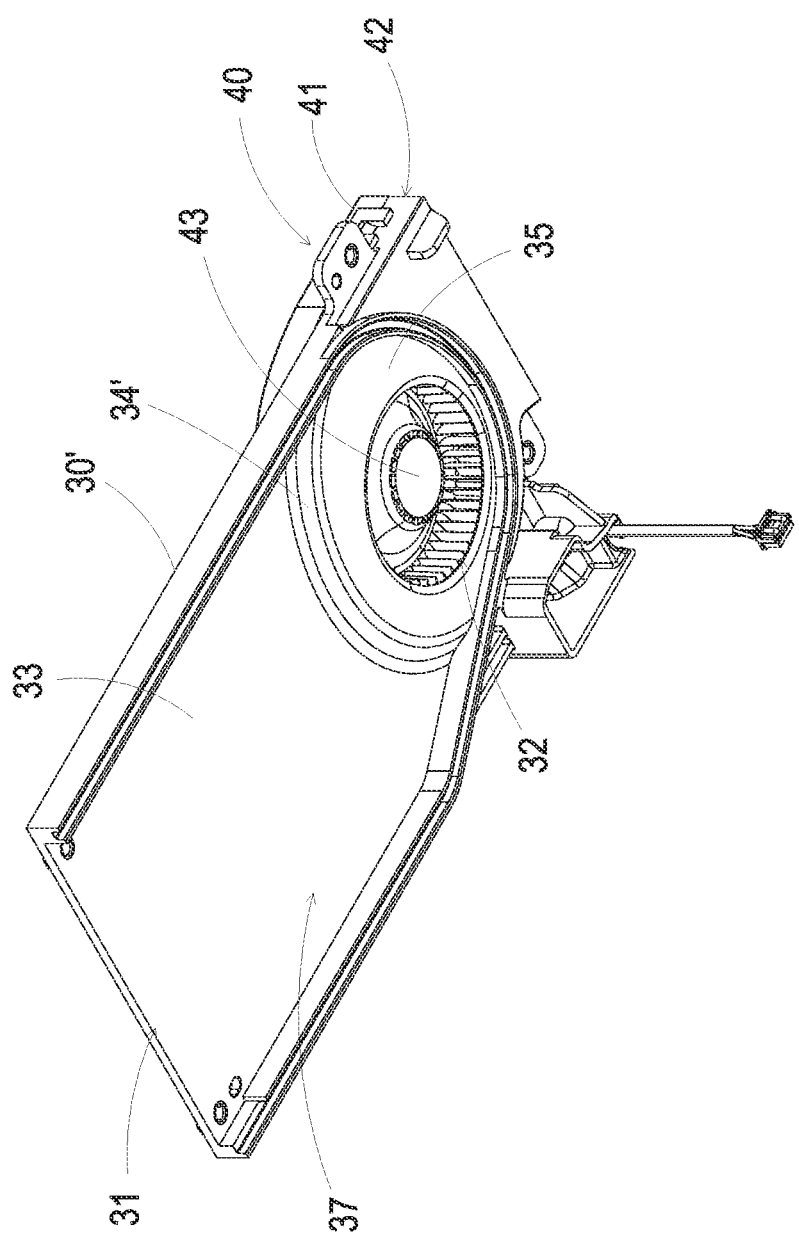
FIG. 18 is a perspective view illustrating a heat dissipation assembly according to a fifth embodiment of the present disclosure.

FIG. 18 is a perspective view illustrating a heat dissipation assembly according to a fifth embodiment of the present disclosure. In the embodiment, the structures, elements and functions of the heat dissipation assembly 1d are similar to those of the heat dissipation assembly 1 of FIGS. 1 to 11, and are not redundantly described herein. As shown in FIG. 18, a heat dissipation assembly 1d is provided and includes a frame 30' and a fan 40. Preferably but not exclusively, the frame 30' covers an object including a heat-generating element (not shown), and the frame 30' includes a heat conduction channel 37 and an airflow intake 31. The airflow intake 31 is disposed adjacent to one end of the frame 30'. The heat conduction channel 37 is communication with an exterior through airflow intake 31. In the embodiment, the frame 30' includes a first plane 33, a second plane 35 and an inclined plane 34'. The first plane 33 is disposed adjacent to the airflow intake 31, the inclined plane 34' is connected between the first plane 33 and the second plane 35. The second plane 35 further includes an inlet 32, and the heat conduction channel 37 is in communication between the airflow intake 31 and the inlet 32. Preferably but not exclusively, the inclined plane 34' is in an arc shape relative to the air intake 32. A cross-section area of the heat conduction channel 37 adjacent to the airflow intake 31 is greater than that of the heat conduction channel 37 adjacent to the inlet 32, and it helps to exert the rectification effect of channel compression when the airflow passes through the heat conduction channel 37. In addition, the fan 40 includes a top cover 41 and an impeller 43. The impeller 43 is disposed on the top cover 41. The top cover 41 is spatially corresponding to the inlet 32, and assembled with the frame 30' to form an outlet 42. The airflow intake 31 and the heat conduction channel 37 are in communication with the outlet 42 through the inlet 32. Notably, the airflow intake 31 and the outlet 42 are located on different sides of the frame 30', respectively. Namely, the airflow intake 31 and the outlet 42 are located on different sides of the inlet 32, respectively. In that, an airflow from the airflow intake 31 to the inlet 32 through the heat conduction channel 37 and an airflow from the inlet 32 to the outlet 42 are located on different levels. Cooperating with the rectification effect of the channel compression of the heat conduction channel 37 or the various characteristic diversification design in the foregoing embodiments, the flow field of the heat dissipation assembly 1d is used effectively, and the purpose of increasing efficiency and reducing noise can be achieved.

As can be seen from the above, by disposing the heat conduction channel 23 with the plurality of fins 20 in front of the inlet 32 of the fan 40, the heat dissipation performance of the plurality of fins 20 accommodated within the heat conduction channel 23 is affected by the intaking airflow of the fan 40 so that the heat dissipation efficiency, the effects of reducing the noise, and the noise quality can be improved at the same time. It should be noted that the effect of channel compression of the heat conduction channel 23 can be realized by adjusting the arrangements of the frame 30, the guiding walls 36, 36a, the frame 30' or the frame 50, and the aforementioned and features and techniques can be combined and adjustable according to the practical requirements. The present disclosure is not limited thereto and not redundantly described herein.

In summary, the present disclosure provides a heat dissipation assembly. A heat conduction channel formed by the heat dissipation fins is arranged at the inlet of the centrifugal fan to produce different heat dissipation effects. The heat dissipation of the heat dissipation fins in the heat conduction channel is implemented by the suction airflow of the centrifugal fan instead of the airflow from the outlet. Since the heat conduction channel is connected to the inlet of the centrifugal fan, a rectification effect is provided by the heat dissipation fins for the inlet of the centrifugal fan. Furthermore, the performance and the noise level of the heat conduction channel are further improved by controlling the cross-section areas of the heat conduction channel and the additive effects of relative characters. In the present disclosure, a frame is combined with the heat dissipation fins and a bottom plate to form a heat conduction channel. The rear end of the heat conduction channel is in communication with the fan and the outlet arranged at different horizontal height through the inlet disposed on the frame. The heat conduction channel arranged in front of the inlet is further combined with the characteristic diversification design of the heat dissipation fins and the cross-sectional reduction of the heat conduction channel to achieve the rectification effect. The center of the impeller of the fan and the inlet are eccentrically designed, and the hub of the impeller of the fan is further matched with the chamfered structures of the heat dissipation fins to design a diversion slope to further achieve the rectification effect. Each of the first ends of the heat dissipation fins adjacent to the airflow intake and the second ends of the heat dissipation fins adjacent to the inlet has the chamfered structure with an inclined angle, which is cooperated with the inclination of the diversion slope of the hub of the impeller. It helps to exert the rectification effect when the airflow is transported from a flow field into another one, and the turbulent energy is reduced by 15%. In addition, the height adjacent to the airflow intake is greater than the height adjacent to the inlet to form a horizontal height difference reaching 50% so that the airflow adjacent to the inlet side of the fan is inputted in a concentrated manner. Moreover, the heat conduction channel with the heat dissipation fins includes the cross-sectional areas varied in a specific ratio so that the concentration effect of the flow field is increased by 20%. On the other hand, in order to correspond to the design of different pressures, the inlet of fan is eccentrically designed relative to the center of the impeller. Furthermore, a distance from the rear end of the heat conduction channel to the center of the impeller, a width ratio of inlet to the heat conduction channel, and opening-area sizes of the outlet and the airflow intake are adjusted correspondingly at the same time so that the flow field is used effectively, and the purposes of increasing the efficiency and reducing the noise are achieved. By disposing the heat dissipation fins within the heat conduction arranged in front of the inlet, under the condition of the same fan speed, the heat dissipation performance of the heat dissipation assembly of the present disclosure is further improved by 15%, and the noise quality is also improved with 10% noise reduction effect.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat dissipation assembly, comprising:
    a bottom plate having a front end and a rear end opposite to each other;
    a plurality of fins disposed on the bottom plate, spaced apart from each other and extended in a direction from the front end to the rear end;
    a frame disposed on the bottom, covering the plurality of fins and assembled with the bottom plate to form a heat conduction channel and an airflow intake, wherein the airflow intake is disposed adjacent to the front end, the heat conduction channel passes through the plurality of fins, and the frame comprises a first plane, a second plane and an inclined plane, wherein the first plane is disposed adjacent to the front end and spatially corresponding to the plurality of fins, the second plane is disposed adjacent to the rear end and comprises an inlet, the heat conduction channel is in communication between the airflow intake and the inlet, and the inclined plane is connected between the first plane and the second plane, wherein a cross-section area of the heat conduction channel adjacent to the airflow intake is greater than that of the heat conduction channel adjacent to the inlet; and
    a fan comprising a top cover and an impeller, wherein the impeller is disposed on the top cover, the top cover is spatially corresponding to the inlet, and assembled with the frame to form an outlet, and the airflow intake and the heat conduction channel are in communication with the outlet through the inlet.

2. The heat dissipation assembly according to claim 1, wherein the frame comprises a guiding wall, a first lateral wall and a second lateral wall, the first lateral wall and the second lateral wall are opposite to each other and connected to two lateral sides of the first plane, respectively, and the guiding wall is disposed on the first plane and connected to the first lateral wall of the frame, wherein the guiding wall is extended along the direction from the front end to the rear end and gradually spaced apart from the first lateral wall to a constant distance.

3. The heat dissipation assembly according to claim 2, wherein a first cross-sectional area of the heat conduction channel adjacent to the airflow intake is collaboratively formed by the first plane, the first lateral wall, the second lateral wall and the bottom plate, wherein a second cross-sectional area of the heat conduction channel passed by the guiding wall is collaboratively formed by the first plane, the guiding wall, the second lateral wall and the bottom plate, wherein the second cross-sectional area is ⅔ times the first cross-sectional area.

4. The heat dissipation assembly according to claim 2, wherein a first cross-sectional area of the heat conduction channel adjacent to the airflow intake is collaboratively formed by the first plane, the first lateral wall, the second lateral wall and the bottom plate, wherein a third cross-sectional area of the heat conduction channel adjacent to the inlet is collaboratively formed by the second plane, the guiding wall, the second lateral wall and the bottom plate, wherein the third cross-sectional area is ½ times the first cross-sectional area.

5. The heat dissipation assembly according to claim 1, wherein a height of the first plane relative to the bottom plate is greater than a height of the second plane relative to the bottom plate.

6. The heat dissipation assembly according to claim 1, wherein the impeller has a blade height, which is greater than a height of the second plane relative to the bottom plate.

7. The heat dissipation assembly according to claim 1, wherein each of the plurality of fins has a first end and a second end opposite to each other, wherein the first end of the fin is disposed adjacent to the airflow intake and has a first chamfered structure, and the first chamfered structure forms a first inclined angle relative to a horizontal plane of the bottom plate, wherein the second end of the fin is disposed adjacent to the inlet and has a second chamfered structure, and the second chamfered structure forms a second inclined angle relative to the horizontal plane of the bottom plate.

8. The heat dissipation assembly according to claim 7, wherein the impeller comprises a hub with a diversion slope, which forms a third inclined angle relative to the horizontal plane of the bottom plate, wherein the third inclined angle is equal to the first inclined angle or the second inclined angle.

9. The heat dissipation assembly according to claim 1, wherein the inlet comprises a leading edge and a trailing edge, which are spatially corresponding to the front end and the rear end, respectively, wherein a first horizontal distance is formed between a center of the impeller and the trailing edge, a second horizontal distance is formed between the center of the impeller and the leading edge, and the first horizontal distance is less than 85% of the second horizontal distance.

10. The heat dissipation assembly according to claim 9, wherein a third horizontal distance is formed between the center of the impeller and an ending of the heat conduction channel, and the third horizontal distance is less than 120% of the first horizontal distance.

11. The heat dissipation assembly according to claim 1, wherein the airflow intake has a first width, the inlet has a second width, and the first width is greater than the second width.

12. The heat dissipation assembly according to claim 1, wherein the airflow intake has a first opening area, the outlet has a second opening area, and the first opening area is larger than the second opening area.

13. The heat dissipation assembly according to claim 1, wherein the frame comprises a guiding wall, a first lateral wall and a second lateral wall, the first lateral wall and the second lateral wall are opposite to each other and connected to two lateral sides of the first plane, respectively, and the guiding wall is disposed on the first plane and connected to the first lateral wall of the frame, wherein the guiding wall is extended along the direction from the front end to the rear end and gradually spaced apart from the first lateral wall.

14. The heat dissipation assembly according to claim 1, wherein upper edges of the plurality of fins are arranged adjacent to the first plane, the inclined plane and the second plane.

15. The heat dissipation assembly according to claim 1, wherein the airflow intake and the outlet are misaligned in view of the direction from the front end to the rear end, and have different heights relative to the bottom plate.

16. A heat dissipation assembly, comprising:
a frame comprising a heat conduction channel and an airflow intake, wherein the airflow intake is disposed adjacent to one end, the heat conduction channel is communication with an exterior through airflow intake, and the frame comprises a first plane, a second plane and an inclined plane, wherein the first plane is disposed adjacent to the airflow intake, the inclined plane is connected between the first plane and the second plane, the second plane comprises an inlet, and the heat conduction channel is in communication between the airflow intake and the inlet, wherein a cross-section area of the heat conduction channel adjacent to the airflow intake is greater than that of the heat conduction channel adjacent to the inlet; and
a fan comprising a top cover and an impeller, wherein the impeller is disposed on the top cover, the top cover is spatially corresponding to the inlet, and assembled with the frame to form an outlet, and the airflow intake and the heat conduction channel are in communication with the outlet through the inlet.

17. The heat dissipation assembly according to claim 16, wherein the inclined plane is in an arc shape relative to the inlet.

18. The heat dissipation assembly according to claim 16, wherein an airflow from the airflow intake to the inlet through the heat conduction channel and an airflow from the inlet to the outlet are located on different levels.

19. The heat dissipation assembly according to claim 16, wherein the airflow intake and the outlet are located on different sides of the frame, respectively.

20. The heat dissipation assembly according to claim 16, wherein the airflow intake and the outlet are located on different sides of the inlet, respectively.

* * * * *